United States Patent
Messick et al.

(10) Patent No.: US 11,928,000 B1
(45) Date of Patent: Mar. 12, 2024

(54) CALIBRATING PROCESSOR SYSTEM POWER CONSUMPTION

(71) Applicant: Dell Products L.P., Round Rock, TX (US)

(72) Inventors: Douglas E. Messick, Austin, TX (US); Craig A. Klein, Elgin, TX (US); John E. Jenne, Georgetown, TX (US); Ralph H. Johnson, Round Rock, TX (US)

(73) Assignee: Dell Products L.P., Round Rock, TX (US)

(*) Notice: Subject to any disclaimer, the term of this patent is extended or adjusted under 35 U.S.C. 154(b) by 35 days.

(21) Appl. No.: 17/895,743

(22) Filed: Aug. 25, 2022

(51) Int. Cl.
| | |
|---|---|
| G06F 1/26 | (2006.01) |
| G01R 19/00 | (2006.01) |
| G01R 31/28 | (2006.01) |
| G06F 1/3206 | (2019.01) |
| G06F 1/3296 | (2019.01) |

(52) U.S. Cl.
CPC ............ *G06F 1/26* (2013.01); *G01R 19/0092* (2013.01); *G01R 31/2832* (2013.01); *G06F 1/3206* (2013.01); *G06F 1/3296* (2013.01)

(58) Field of Classification Search
CPC ........ G06F 1/3206; G06F 1/3296; G06F 1/26; G01R 19/0092; G01R 31/2832
See application file for complete search history.

(56) References Cited

U.S. PATENT DOCUMENTS

| | | | |
|---|---|---|---|
| 10,852,796 B2 | 12/2020 | Messick et al. | |
| 11,237,611 B2 | 2/2022 | Messick et al. | |
| 2006/0284674 A1* | 12/2006 | Hong | G06F 1/26 330/129 |
| 2017/0248996 A1* | 8/2017 | Zhang | G06F 1/26 |
| 2020/0042063 A1 | 2/2020 | Messick et al. | |
| 2020/0293419 A1 | 9/2020 | Messick et al. | |
| 2021/0096623 A1 | 4/2021 | Rhinehart et al. | |
| 2021/0175806 A1* | 6/2021 | Aulagnier | H02M 3/1584 |

* cited by examiner

*Primary Examiner* — Terrell S Johnson
(74) *Attorney, Agent, or Firm* — Larson Newman, LLP

(57) ABSTRACT

An information handling system includes a management controller that may determine average power consumption of a processor, and determine average power measurement at a power supply unit. If the average power consumption of the processor does not match the average power measurement at the power supply unit, then the system may calibrate the average power consumption of the processor to match the average power measurement at the power supply unit.

20 Claims, 7 Drawing Sheets

CALIBRATING PROCESSOR SYSTEM POWER CONSUMPTION

FIELD OF THE DISCLOSURE

The present disclosure generally relates to information handling systems, and more particularly relates to calibrating processor system power consumption.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a management controller that may determine average power consumption of a processor, and determine average power measurement at a power supply unit. If the average power consumption of the processor does not match the average power measurement at the power supply unit, then the system may calibrate the average power consumption of the processor to match the average power measurement at the power supply unit.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
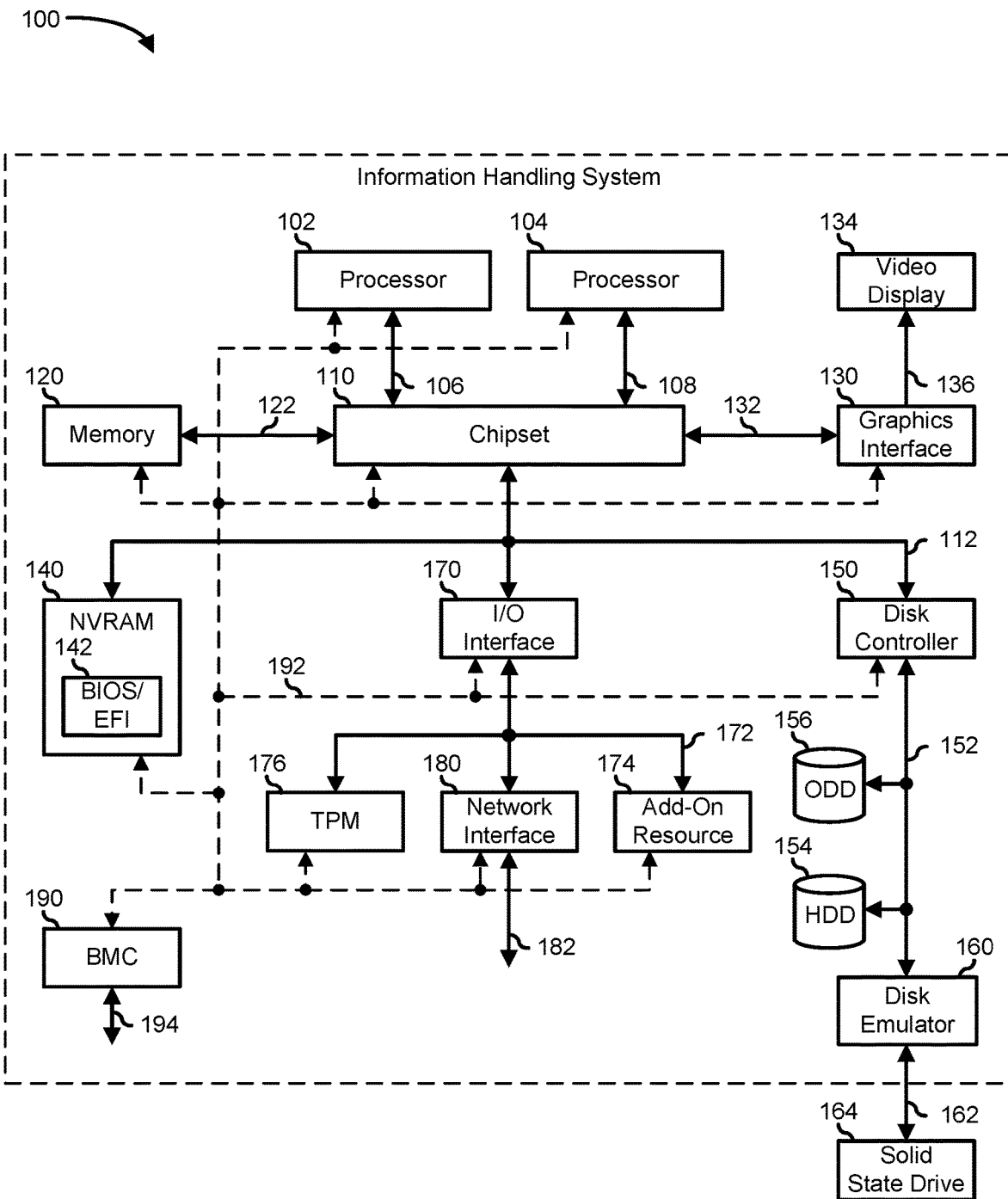
FIG. 1 is a block diagram illustrating an information handling system according to an embodiment of the present disclosure.

FIG. 1 illustrates an embodiment of an information handling system 100 including processors 102 and 104, a chipset 110, a memory 120, a graphics adapter 130 connected to a video display 134, a non-volatile RAM (NV-RAM) 140 that includes a basic input and output system/extensible firmware interface (BIOS/EFI) module 142, a disk controller 150, a hard disk drive (HDD) 154, an optical disk drive 156, a disk emulator 160 connected to a solid-state drive (SSD) 164, an input/output (I/O) interface 170 connected to an add-on resource 174 and a trusted platform module (TPM) 176, a network interface 180, and a baseboard management controller (BMC) 190. Processor 102 is connected to chipset 110 via processor interface 106, and processor 104 is connected to the chipset via processor interface 108. In a particular embodiment, processors 102 and 104 are connected together via a high-capacity coherent fabric, such as a HyperTransport link, a QuickPath Interconnect, or the like. Chipset 110 represents an integrated circuit or group of integrated circuits that manage the data flow between processors 102 and 104 and the other elements of information handling system 100. In a particular embodiment, chipset 110 represents a pair of integrated circuits, such as a northbridge component and a southbridge component. In another embodiment, some or all of the functions and features of chipset 110 are integrated with one or more of processors 102 and 104.

Memory 120 is connected to chipset 110 via a memory interface 122. An example of memory interface 122 includes a double data rate (DDR) memory channel and memory 120 represents one or more DDR dual in-line memory modules (DIMMs). In a particular embodiment, memory interface 122 represents two or more DDR channels. In another embodiment, one or more of processors 102 and 104 include a memory interface that provides a dedicated memory for the processors. A DDR channel and the connected DDR DIMMs can be in accordance with a particular DDR standard, such as a DDR3 standard, a DDR4 standard, a DDR5 standard, or the like.

Memory 120 may further represent various combinations of memory types, such as dynamic random access memory (DRAM) DIMMs, static random access memory (SRAM) DIMMs, non-volatile DIMMs (NV-DIMMs), storage class memory devices, read-only memory (ROM) devices, or the like. Graphics adapter 130 is connected to chipset 110 via a graphics interface 132 and provides a video display output 136 to a video display 134. An example of a graphics interface 132 includes a peripheral component interconnect-express (PCIe) interface and graphics adapter 130 can include a four-lane (x4) PCIe adapter, an eight-lane (x8) PCIe adapter, a 16-lane (x16) PCIe adapter, or another configuration, as needed or desired. In a particular embodiment, graphics adapter 130 is provided down on a system printed circuit board (PCB). Video display output 136 can include a digital video interface (DVI), a high-definition multimedia interface (HDMI), a DisplayPort interface, or the like, and video display 134 can include a monitor, a smart television, an embedded display such as a laptop computer display, or the like.

NV-RAM 140, disk controller 150, and I/O interface 170 are connected to chipset 110 via an I/O channel 112. An example of I/O channel 112 includes one or more point-to-point PCIe links between chipset 110 and each of NV-RAM 140, disk controller 150, and I/O interface 170. Chipset 110 can also include one or more other I/O interfaces, including a PCIe interface, an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. NV-RAM 140 includes BIOS/EFI module 142 that stores machine-executable code (BIOS/EFI code) that operates to detect the resources of information handling system 100, to provide drivers for the resources, to initialize the resources, and to provide common access mechanisms for the resources. The functions and features of BIOS/EFI module 142 will be further described below.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits SSD 164 to be connected to information handling system 100 via an external interface 162. An example of external interface 162 includes a USB interface, an institute of electrical and electronics engineers (IEEE) 1394 (Firewire) interface, a proprietary interface, or a combination thereof. Alternatively, SSD 164 can be disposed within information handling system 100.

I/O interface 170 includes a peripheral interface 172 that connects the I/O interface to add-on resource 174, to TPM 176, and to network interface 180. Peripheral interface 172 can be the same type of interface as I/O channel 112 or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral interface 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on a separate circuit board or an add-in card disposed within information handling system 100, a device that is external to the information handling system, or a combination thereof.

Network interface 180 represents a network communication device disposed within information handling system 100, on a main circuit board of the information handling system, integrated onto another component such as chipset 110, in another suitable location, or a combination thereof. Network interface 180 includes a network channel 182 that provides an interface to devices that are external to information handling system 100. In a particular embodiment, network channel 182 is of a different type than peripheral interface 172, and network interface 180 translates information from a format suitable to the peripheral channel to a format suitable to external devices.

In a particular embodiment, network interface 180 includes a NIC or host bus adapter (HBA), and an example of network channel 182 includes an InfiniBand channel, a Fibre Channel, a Gigabit Ethernet channel, a proprietary channel architecture, or a combination thereof. In another embodiment, network interface 180 includes a wireless communication interface, and network channel 182 includes a Wi-Fi channel, a near-field communication (NFC) channel, a Bluetooth® or Bluetooth-Low-Energy (BLE) channel, a cellular-based interface such as a Global System for Mobile (GSM) interface, a Code-Division Multiple Access (CDMA) interface, a Universal Mobile Telecommunications System (UMTS) interface, a Long-Term Evolution (LTE) interface, or another cellular based interface, or a combination thereof. Network channel 182 can be connected to an external network resource (not illustrated). The network resource can include another information handling system, a data storage system, another network, a grid management system, another suitable resource, or a combination thereof.

BMC 190 is connected to multiple elements of information handling system 100 via one or more management interface 192 to provide out-of-band monitoring, maintenance, and control of the elements of the information handling system. As such, BMC 190 represents a processing device different from processor 102 and processor 104, which provides various management functions for information handling system 100. For example, BMC 190 may be responsible for power management, cooling management, and the like. The term BMC is often used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller and embedded controllers included at the blades of the blade server can be referred to as blade management controllers. Capabilities and functions provided by BMC 190 can vary considerably based on the type of information handling system. BMC 190 can operate in accordance with an Intelligent Platform Management Interface (IPMI). Examples of BMC 190 include an Integrated Dell® Remote Access Controller (iDRAC).

Management interface 192 represents one or more out-of-band communication interfaces between BMC 190 and the elements of information handling system 100, and can include an Inter-Integrated Circuit (I2C) bus, a System Management Bus (SMBUS), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a PCIe interface, a Network Controller Sideband Interface (NC-SI), or the like. As used herein, out-of-band access refers to operations performed apart from a BIOS/operating system execution environment on information handling system 100, that is apart from the execution of code by processors 102 and 104 and procedures that are implemented on the information handling system in response to the executed code.

BMC 190 operates to monitor and maintain system firmware, such as code stored in BIOS/EFI module 142, option ROMs for graphics adapter 130, disk controller 150, add-on resource 174, network interface 180, or other elements of information handling system 100, as needed or desired. In particular, BMC 190 includes a network interface 194 that can be connected to a remote management system to receive firmware updates, as needed or desired. BMC 190 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 190 utilizes various protocols and application programming interfaces (APIs) to direct and control the processes for monitoring and maintaining the system firmware. An example of a protocol or API for monitoring and maintaining the system firmware includes a graphical user interface (GUI) associated with BMC 190, an interface defined by the Distributed Management Taskforce (DMTF) (such as a Web Services Management (WSMan) interface, a Management Component Transport Protocol (MCTP) or, a Redfish® interface), various vendor-defined interfaces (such as a Dell EMC Remote Access Controller Administrator (RACADM) utility, a Dell EMC OpenManage Enterprise, a Dell EMC OpenManage Server Administrator (OMSS) utility, a Dell EMC OpenManage Storage Services (OMSS) utility, or a Dell EMC OpenManage Deployment Toolkit (DTK) suite), a BIOS setup utility such as invoked by a "F2" boot option, or another protocol or API, as needed or desired.

In a particular embodiment, BMC 190 is included on a main circuit board (such as a baseboard, a motherboard, or any combination thereof) of information handling system 100 or is integrated onto another element of the information handling system such as chipset 110, or another suitable element, as needed or desired. As such, BMC 190 can be part of an integrated circuit or a chipset within information handling system 100. An example of BMC 190 includes an iDRAC, or the like. BMC 190 may operate on a separate power plane from other resources in information handling system 100. Thus BMC 190 can communicate with the management system via network interface 194 while the resources of information handling system 100 are powered off. Information can be sent from the management system to BMC 190 and the information can be stored in a RAM or NV-RAM associated with the BMC. Information stored in the RAM may be lost after power-down of the power plane for BMC 190, while information stored in the NV-RAM may be saved through a power-down/power-up cycle of the power plane for the BMC.

Information handling system 100 can include additional components and additional busses, not shown for clarity. For example, information handling system 100 can include multiple processor cores, audio devices, and the like. While a particular arrangement of bus technologies and interconnections is illustrated for the purpose of example, one of skill will appreciate that the techniques disclosed herein are applicable to other system architectures. Information handling system 100 can include multiple central processing units (CPUs) and redundant bus controllers. One or more components can be integrated together. Information handling system 100 can include additional buses and bus protocols, for example, I2C and the like. Additional components of information handling system 100 can include one or more storage devices that can store machine-executable code, one or more communications ports for communicating with external devices, and various input and output (I/O) devices, such as a keyboard, a mouse, and a video display.

For purposes of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smartphone, a tablet device or other consumer electronic device, a network server, a network storage device, a switch, a router, or another network communication device, or any other suitable device and may vary in size, shape, performance, functionality, and price. Further, information handling system 100 can include processing resources for executing machine-executable code, such as processor 102, a programmable logic array (PLA), an embedded device such as a System-on-a-Chip (SoC), or other control logic hardware. Information handling system 100 can also include one or more computer-readable media for storing machine-executable code, such as software or data.

Power supply units provide an analog power signal, such as Psys (platform power) introduced by Intel®, to a voltage regulator in an information handling system. The analog power signal may represent the power output or instantaneous power of power supply units provided to voltage regulators. If there are multiple voltage regulators, then the analog power signal may be provided to a lead voltage regulator that powers a processor. The analog power signal may also be used to control system power under a programmable limit. As such, the analog power signal may be used in power control and hardware protection policies such as those associated with processors 102 and 104 of FIG. 1.

Processor manufacturers provide power measurement accuracy requirements. For example, Intel's accuracy requirement is at +/−3% above 50% load. An error above the accuracy requirement can impact a processor's power control loops. For example, if a processor measures its consumed power at 4% too low, then this may affect the enforcement of power limits set by hardware and/or user policies which could potentially cause performance degradation. In addition, an end-user may determine that the processor is not performing at its expected performance level. However, currently, there is no system or method to detect that the error is outside the accuracy requirements. Nor there is a system or method to mitigate the issues that may come up because of the deviation from the accuracy requirements. To address these and other issues, the present disclosure provides a system and method for more accurate power consumption detection and associated mitigating features when a deviation from the power consumption accuracy requirement is detected.

Figure 2:
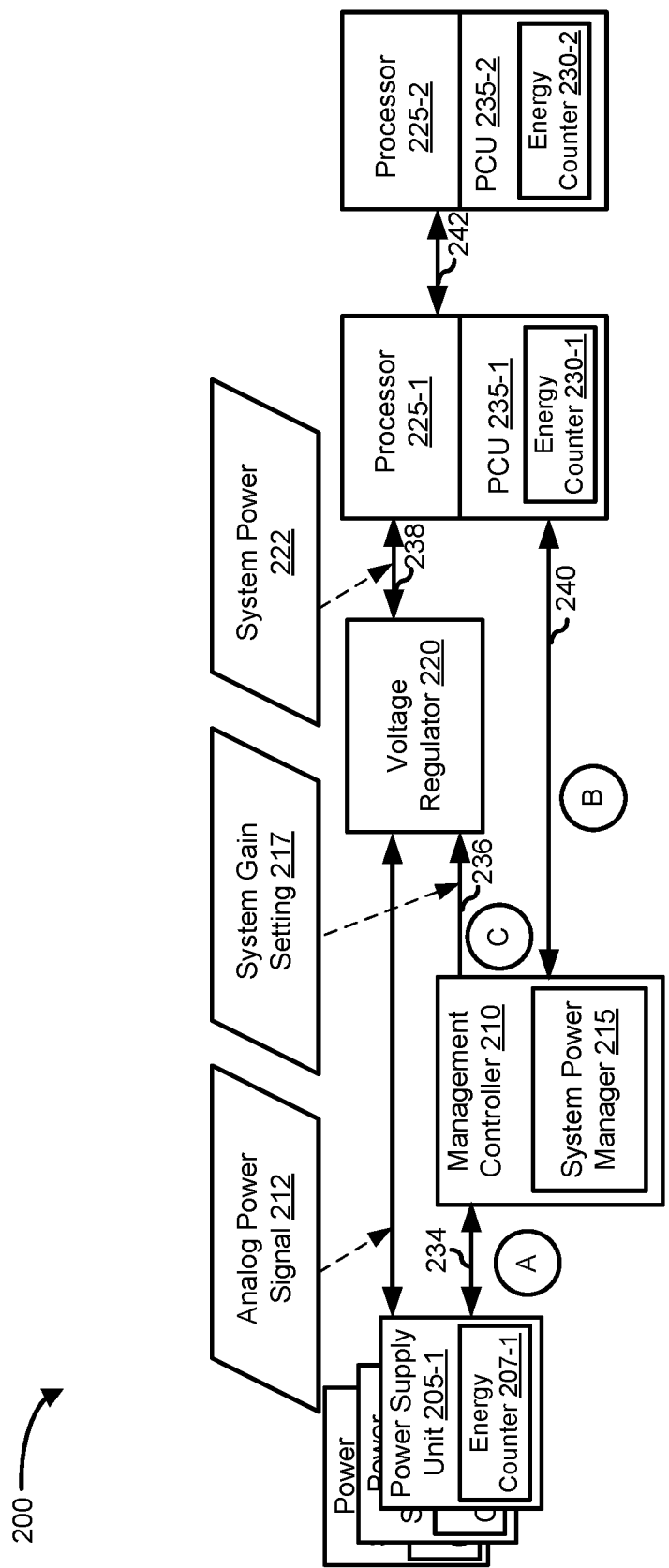
FIG. 2 is a block diagram illustrating a system for calibrating processor system power consumption, according to an embodiment of the present disclosure.

FIG. 2 illustrates a system 200 for calibrating processor system power consumption. In this example, system 200 provides a closed loop calibration algorithm that may be used to dial out an error of an analog power signal to deliver more accurate results. System 200 includes one or more power supply units, such as power supply units 205-1 through 205-*n*, and one or more processors, such as processors 225-1 and 225-2. System 200 also includes a management controller 210 and a voltage regulator 220. System 200 may be part of an information handling system, such as information handling system 100 of FIG. 1.

In various embodiments, the components of system 200 may be implemented in hardware, software, firmware, or any combination thereof. The components shown are not drawn to scale and system 200 may include additional or fewer components. In addition, connections between components may be omitted for descriptive clarity. Furthermore, some components that are represented as separate components may in certain embodiments instead are integrated with other components. For example, in certain embodiments, all or a portion of the functionality provided by the illustrated components may instead be provided by components integrated into one or more processor(s) as a system-on-a-chip.

Power supply units 205-1 through 205-*n* (also referred to herein as "power supply units 205" or "power supply unit 205"), may include any system, device, or apparatus configured to supply electrical current to one or more resources or components of an information handling system. Power supply unit 205 may be a direct current power source. For example, power supply units 205 may be hot-swap controllers, batteries, capacitors, etc. Power supply units 205 may be coupled to the components of the information handling system, such as processors 225-1 and 225-2 (also referred to herein as "processors 205" or "processor 205"), via voltage regulator 220. Power supply units 205 may provide analog power signal 212 to voltage regulator 220. Analog power signal 212 may be used to inform the processors 225 of instantaneous system power, such as system power 222 that is provided via voltage regulator 220. Accordingly, voltage regulator 220 may convert analog power signal 212 to system power 222 which is then transmitted to processor 225 via interface 238.

Power supply units 205 include energy counters 207 configured to monitor the amount of power and/or energy currently being provided by power supply units 205. For example, energy counters 207 may calculate an average power provided by power supply units 205 over a period of time. In one embodiment, energy counters 207 may be configured to take a running average of actual power measurements of power supply units 205. In the present disclosure, management controller 210 may be configured to read the energy counters 207 of power supply units 205 to determine the average power provided by power supply units 205 to voltage regulator 220. In this example, the power measurement at power supply units 205 may be treated as a calibration standard, target power level, or "center of truth" to which the average power consumption of processors 225 may be calibrated.

Voltage regulator 220 may be a device, system, or apparatus, configured to provide a constant voltage and current to power processors 225. For example, voltage regulator 220 may receive a power signal, such as analog power signal 212, from power supply units 205 and produce system power 222 for processors 225. Voltage regulator 220 may be coupled to processor s 225-1 and processor 225-2 (also referred to herein as "processors 205" or "processor 205") via a single power plane or multiple power planes. The output current and/or voltage may be adjusted based on the value of a system gain setting, also referred to as a conversion factor.

The system gain setting may be a system voltage gain setting or a current gain setting, such as ISYS_GAIN of VR14™ by Intel®, which is used to further control the delivered instantaneous power. The value of the system gain setting may be stored in one of the registers of voltage regulator 220. This value may be dynamically increased or decreased at runtime to ensure that the power consumption of processors 225 matches the power provided by power supply units 205. In one embodiment, the value of the system gain setting register, like the ISYS_GAIN of Intel® may be adjusted. Voltage regulator 220 may be communicatively coupled to management controller 210 via interface 236, wherein the interface may be used to program the adjusted value of the system gain setting in voltage regulator 220.

Processors 225 may include any system, device, or apparatus operable to interpret and/or execute program instructions and/or process data, and may include without limitation a microprocessor, microcontroller, digital signal processor, application-specific integrated circuit (ASIC), or any other digital or analog circuitry configured to interpret and/or execute program instructions and/or process data stored in the memory and/or another component of the information handling system. As such, processors 225 also referred to herein as CPUs, are similar to processor 102 and processor 104 of FIG. 1.

Processors 225 includes power control units (PCU) 235 which resides in a system agent of each processor and is a combination of hardware state machines and an integrated microcontroller. PCU 235 may be configured to collect telemetry information, such as power consumption and junction temperature. In one embodiment, PCU 235 includes energy counters 230 that are configured to monitor or track the power and/or energy consumption of processors 225 over a certain configurable time window. For example, energy counters 230 may calculate an average power consumed by processors 225 over a particular period. In one embodiment, each energy counters 230 may be part of a running average power limit module. In one embodiment, energy counters 230 may be configured to take a running average of actual power measurements of processors 225. The actual power measurements may be derived from reported instantaneous power from voltage regulator 220. In the present disclosure, management controller 210 may be configured to read the energy counters of processors 225 to determine the average power consumed by processors 225.

Management controller 210 may be configured to provide out-of-band management facilitates or management of the information handling system. Such management may be made by management controller 210 even if the information handling system is powered off or powered to a standby state. Management controller 210 may include a processor, memory, and out-of-band network interface separate from and physically isolated from an in-band network interface of the information handling system and/or other embedded information handling resources. In certain embodiments, management controller 210 may include or may be an integral part of a BMC, embedded controller, service processor, or a remote access controller. In other embodiments, management controller 210 may include or may be an integral part of an enclosure controller. In some embodiments, management controller 210 may be communicatively coupled with power supply units 205, voltage regulator 220, and processors 225 to communicate control and/or telemetry data.

Management controller 210 may include a system power manager 215 which may be configured to read the information from energy counters 207 and energy counters 230. Based on the information, system power manager 215 may determine whether the average power of processor 225 matches a particular average power target, such as the average power of power supply units 205 based on the information from the energy counters. If the average power of processor 225 does not match the average power of power supply units 205, system power manager 215 may calculate a value of a system gain setting and program voltage regulator 220 with the calculated value. Voltage regulator 220 may use the system gain setting to calibrate the average power consumed by processors 225 to match the average power from power supply units 205.

By adjusting the value of the system gain setting in voltage regulator 220, the instantaneous power provided to processors 225 may be adjusted such as the running average of actual power measurements of processors 225 may match the running average of actual power measurements of power supply units 205. For example, system power manager 215 may adjust the value of the system gain setting based on whether the average power consumption of processors 225 is greater than, less than, or equal to the average power measurements of power supply units 205.

System power manager 215 may be configured to periodically perform the calibration, such as every one hundred milliseconds, or similar. Further, system power manager 215 may be configured to implement the adjustment within a relatively short period, such as in the order of one microsecond upon detection that the average power consumption of processors 225 does not match the average power measurements of power supply units 205. Because of the frequency of the calibration and the adjustment performed in a short period, management controller 210 may be able to respond quickly to dynamic events, such as load changes, power supply unit redundancy changes, or power supply unit hot spare state changes, with a high accuracy rate.

FIG. 2 is annotated with a series of letters A, B, and C. Each of these letters represents a stage of one or more operations. Although these stages are ordered for this example, the stages illustrate one example to aid in understanding this disclosure and should not be used to limit the claims. Subject matter falling within the scope of the claims can vary with respect to the order of the operations.

Analog power signal 212 may be sourced from power supply units 205, which is then routed to voltage regulator 220. Voltage regulator 220 converts analog power signal 212 to an instantaneous power, such as system power 222 for processors 225 and transmit system power 222 to processors 225 via interface 238, which may use a serial voltage identification protocol. The conversion may be performed via an analog-to-digital converter which uses a value of a system gain setting 217 to update the value of system power 222 during the conversion. For example, the system power 222 may be increased or decreased based on the value of system gain setting 217.

In one embodiment, management controller 210 may perform stages A, B, and C or portions thereof. At stage A, management controller 210 may read energy counters 207 of power supply units 205-1-205-$n$ using an interface 234 which may be a power management bus (PMBus), wherein the PMBus is a two-wire communications protocol based on I2C. At stage B, management controller 210 may read energy counters 230 of processors 225 using interface 240 which may be a platform environment control enterprise (PECI). The PECI is an Intel ° proprietary single wire serial interface that provides a communication channel between Intel ° processors and chipset components to external system management logic, such as management controller 210.

At stage C, management controller 210 may program a value of system gain setting 217 registers of voltage regulator 220 via interface 236 which may be a PMBus similar to interface 234. Management controller 210 may program the value of system gain setting 217 to calibrate the power consumed by processors 225 to match the power provided by power supply units 205. In this example, adjusting system gain setting 217 may change the value of system power 222 with the value of analog power signal 212 constant. Accordingly, when the value of system power 222 is changed, the value of the average power consumption of processor 225 is changed, wherein the average power consumption of processor 225 is the average of system power 222 over a particular period.

Those of ordinary skill in the art will appreciate that the configuration, hardware, and/or software components of system 200 depicted in FIG. 2 may vary. For example, the illustrative components within system 200 are not intended to be exhaustive, but rather are representative to highlight components that can be utilized to implement aspects of the present disclosure. For example, even though system 200 includes one voltage regulator and more than one power supply unit, system 200 may include one power supply unit and/or additional voltage regulators.

Accordingly, system 200 may include one or more than the two processors depicted herein. In addition, system 200 may include more than one management controller. Further, other devices and/or components may be used in addition to or in place of the devices/components depicted. The depicted example does not convey or imply any architectural or other limitations with respect to the presently described embodiments and/or the general disclosure. In the discussion of the figures, reference may also be made to components illustrated in other figures for continuity of the description.

Figure 3:
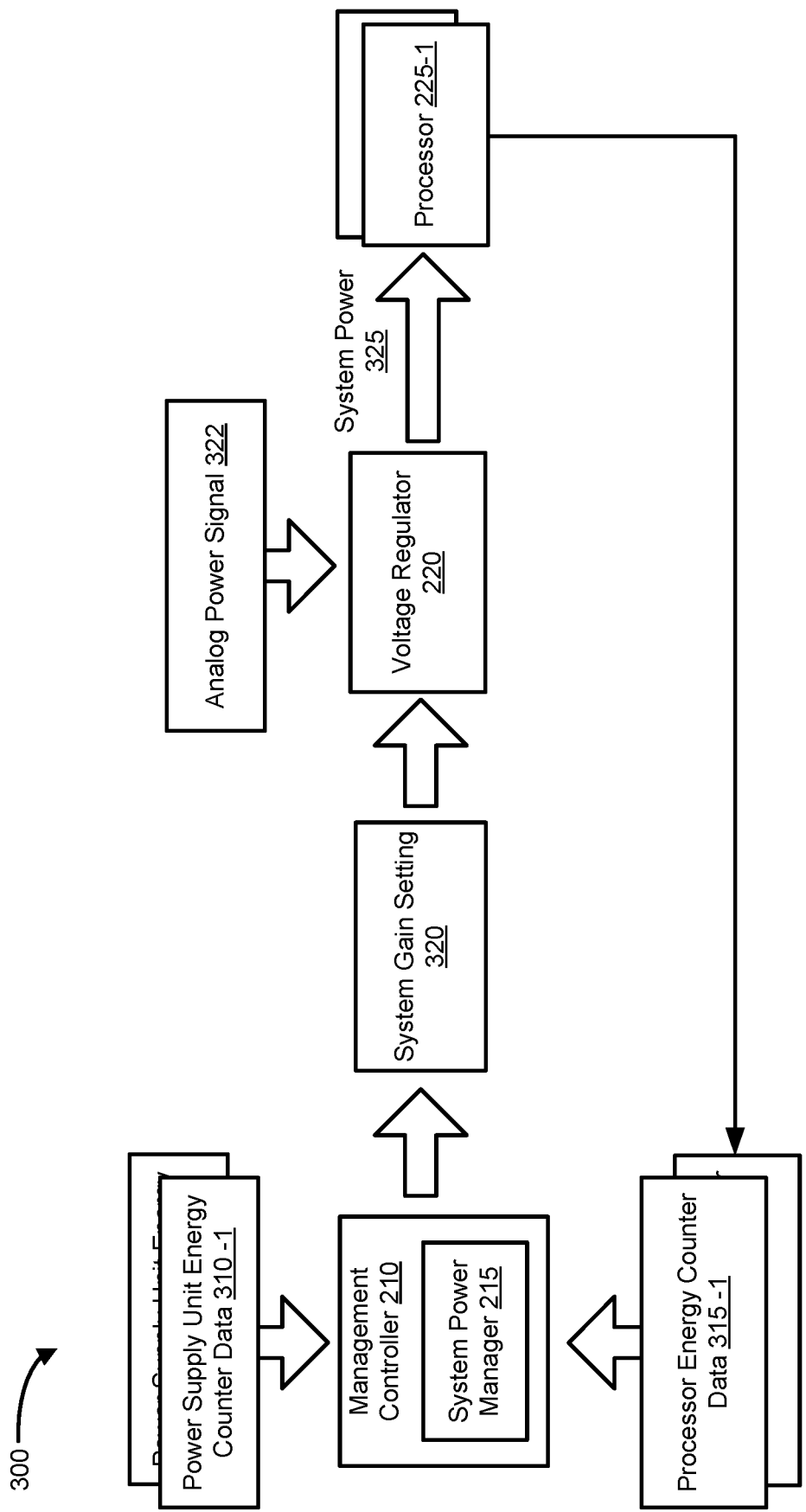
FIG. 3 is a block diagram illustrating a method for calibrating processor system power consumption, according to an embodiment of the present disclosure.

FIG. 3 shows a system 300 for calibrating processor system power consumption. In this example, system 300, which is similar to system 200, provides a closed loop calibration algorithm that may be used to dial out the error of the analog power signal to deliver more accurate results continually. System 300 includes management controller 210, voltage regulator 220, and processors 225, wherein voltage regulator 220 is between power supply units 205 and processors 225. System 300 may be part of an information handling system, such as information handling system 100 of FIG. 1.

In this example, management controller 210 may read power supply unit energy counter data 310-1 through 310-$n$ (also referred to as "power supply unit energy counter data 310") and processor energy counter data 315-1 through 315-$n$ (also referred to as "processor energy counter data 315"). Power supply unit energy counter data 310 may include a power measurement reading from each of energy counters 207. Processor energy counter data 315 may include an average power consumption reading from each of energy counters 207.

Based on whether processor energy counter data 315 matches power supply unit energy counter data 310, system power manager 215 calculates the value of system gain setting 320, which may have watts/volts as its unit of measurement, is programmed into voltage regulator 220. Voltage regulator 220 may receive analog power signal 322 from power supply unit 205 as input and may output system power 325 based on analog power signal 322 and system gain setting 320. System power 325 may represent instantaneous power transmitted to processor 225 for consumption. In this example, analog power signal 322 is similar to analog power signal 212 of FIG. 2, while system gain setting 320 is similar to system gain setting 217 of FIG. 2, and system power 325 is similar to system power 222 of FIG. 2.

The system power manager 215 may be configured to calibrate system power 325 reported to the processors 225 continuously based on periodically reading energy counters 207 and energy counters 230. The calibration may be used to reduce error and increase the accuracy of the system power 325. The calibration addresses various issues such as the non-linear gain of the voltage regulator, an inherent offset of the analog-to-digital converter, etc. which may be caused by a mismatch of the power output of the voltage regulator from the power transmitted by the power supply units, such as mismatch between power supply unit energy counter data 310 and processor energy counter data 315.

Figure 4:
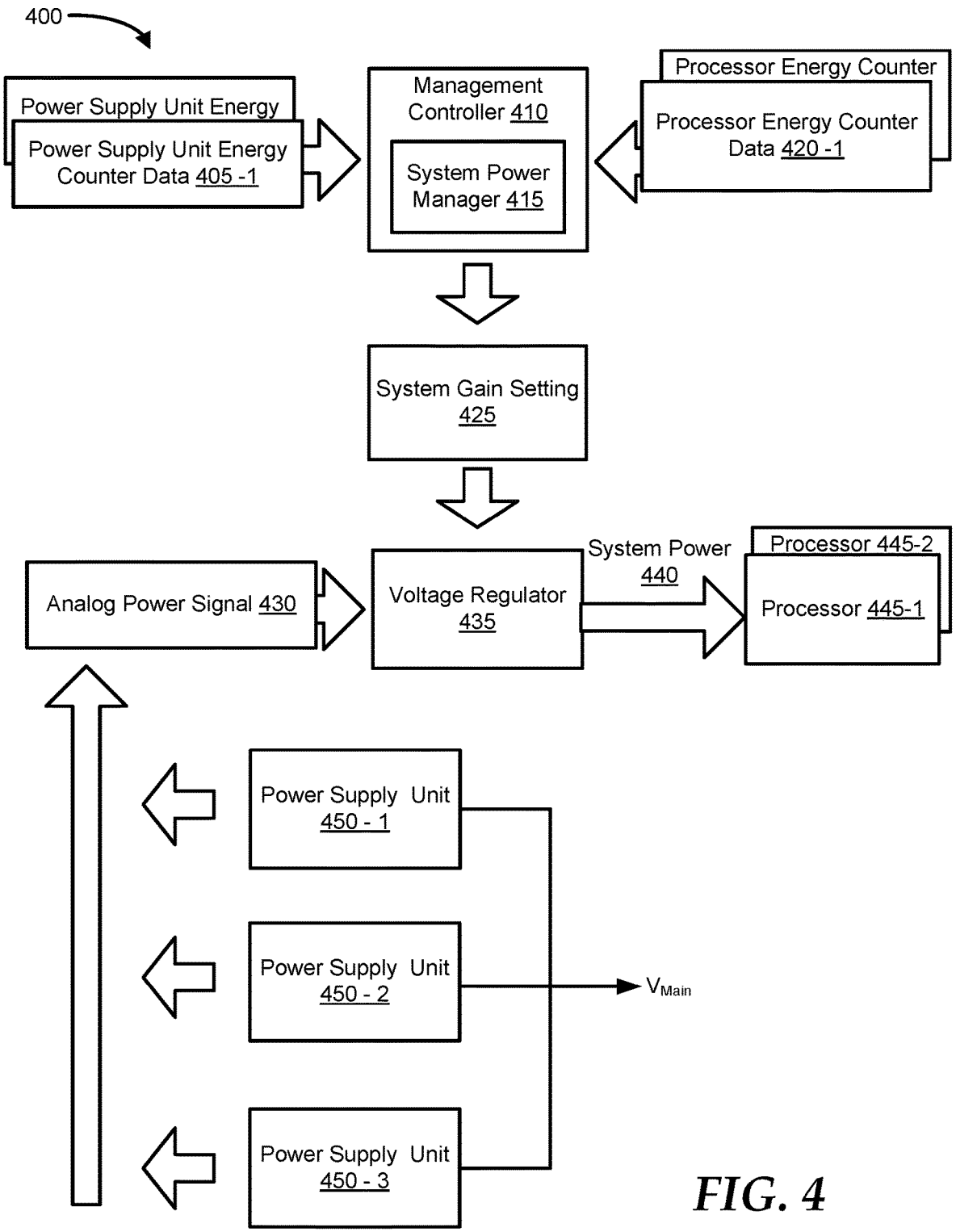
FIG. 4 is a block diagram illustrating a method for calibrating processor system power consumption, according to an embodiment of the present disclosure.

FIG. 4 shows a system 400 for calibrating processor system power consumption. In this example, system 400, which is similar to system 300, provides a closed loop calibration algorithm that may be used to dial out the error of the analog power signal to deliver more accurate results continually. System 400 includes a management controller 410, a voltage regulator 435, power supply units 450-1 through 450-n (also referred to as "power supply units 450" or "power supply unit 450"), and processors 445-1 through 445-n (also referred to as "processors 445" or processor 445"). Voltage regulator 435 is between power supply units 450 and processors 445. System 400 may be part of an information handling system, such as information handling system 100 of FIG. 1. In this example, power supply units 450 are monolithic power supply units, wherein each one includes an integrated current monitor. Power supply units 450 may also be configured to provide primary power voltage also referred to as $V_{Main}$ to various components of the information handling system.

In this example, management controller 410 may read power supply unit energy counter data 405-1(also referred to as "power supply unit energy counter data 405") and processor energy counter data 420-1 through 420-n (also referred to as "processor energy counter data 420"). Power supply unit energy counter data 405 may include a power measurement reading from each of the energy counters included in power supply units 450. Processor energy counter data 420 may include an average power consumption reading from each of energy counters of processors 445.

Based on whether processor energy counter data 420 matches current monitor energy counter data 405, system power manager 415 calculates the value of system gain setting 425 which may have watts/volts as its unit of measurement. System gain setting 425 may then be programmed into voltage regulator 435. Voltage regulator 435 may also receive analog power signal 430 from power supply units 450 as input and may output system power 440 based on analog power signal 430 and system gain setting 425. System power 440 may represent instantaneous power transmitted to processor 445 for consumption. In this example, analog power signal 430 is similar to analog power signal 212 of FIG. 2, while system gain setting 425 is similar to system gain setting 217 of FIG. 2, and system power 440 is similar to system power 222 of FIG. 2.

The system power manager 415 may be configured to calibrate system power 440 reported to the processors 445 continuously based on periodically reading the energy counters of processors 445 and energy counters of power supply units 450. Similar to system 300, the calibration may be used to address various issues, such as a mismatch between the power consumption of processors 445 and power provided by power supply units 450.

Figure 5:
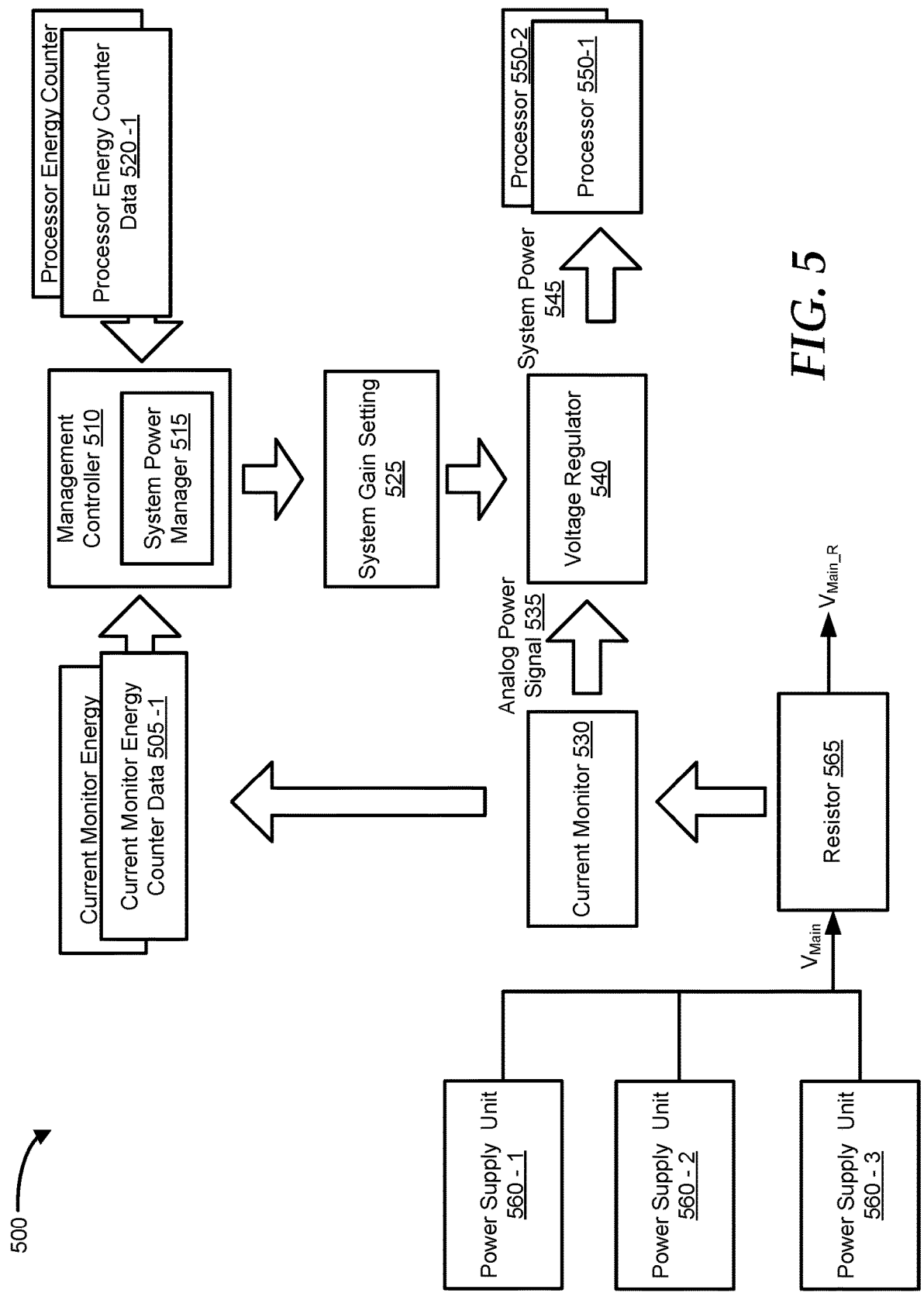
FIG. 5 is a block diagram illustrating a method for calibrating processor system power consumption, according to an embodiment of the present disclosure.

FIG. 5 shows a system 500 for calibrating processor system power consumption. In this example, system 500, which is similar to system 300, provides a closed loop calibration algorithm that may be used to dial out the error of the analog power signal to deliver more accurate results continually. System 500 includes a management controller 510, a current monitor 530, a voltage regulator 540, processors 550-1 through 550-n (also referred to as "processors 550" or processor 550"), and power supply units 560-1 through 560-n (also referred to as "power supply units 560" or "power supply unit 560"), wherein voltage regulator 540 is between power supply units 560 and processors 550. System 500 may be part of an information handling system, such as information handling system 100 of FIG. 1.

In this example, power supply units 560 are monolithic power supply units with planar current monitor 530. Power supply units 560 provide a main power source, such as $V_{Main}$, which may pass through a resistor 565 before reaching current monitor 530. Current monitor 530 may be one or more electronic component(s) configured to monitor a current and/or power associated with one or more other component(s) of the information handling system, such as power supply units 560. For example, current monitor 530 may periodically read energy counters of power supply unit 560.

In this example, management controller 510 may receive current monitor energy counter data 405-1 through 405-n (also referred to as "current monitor energy counter data 405") and processor energy counter data 315-1 through 315-n (also referred to as "processor energy counter data 420"). Current monitor energy counter data 505 may include a power measurement reading from each of the energy counters included in power supply units 450 by current monitor 530. For example, current monitor 530 may provide current monitor energy counter data 505 which may include average power consumption reading from each of energy counters of power supply units 560.

Based on whether processor energy counter data 420 matches current monitor energy counter data 405, system power manager 515 calculates the value of system gain setting 525 which may have watts/volts as its unit of measurement. System gain setting 525 may then be programmed into voltage regulator 540. Voltage regulator 540 may receive analog power signal 535 from current monitor 530 as input and may output system power 545 based on analog power signal 535 and system gain setting 525. System power 545 may represent instantaneous power transmitted to processors 550 for consumption. In this example, analog power signal 535 is similar to analog power signal 212 of FIG. 2, while system gain setting 525 is similar to system gain setting 217 of FIG. 2, and system power 545 is similar to system power 222 of FIG. 2.

The system power manager 515 may be configured to calibrate system power 545 reported to the processors 550. The calibration may be performed based on current monitor energy counter data 505 and processor energy counter data 520. Similar to system 300, the calibration may be used to address various issues, such as a mismatch between the power consumption of processors 550 and the power provided by power supply units 560.

Figure 6:
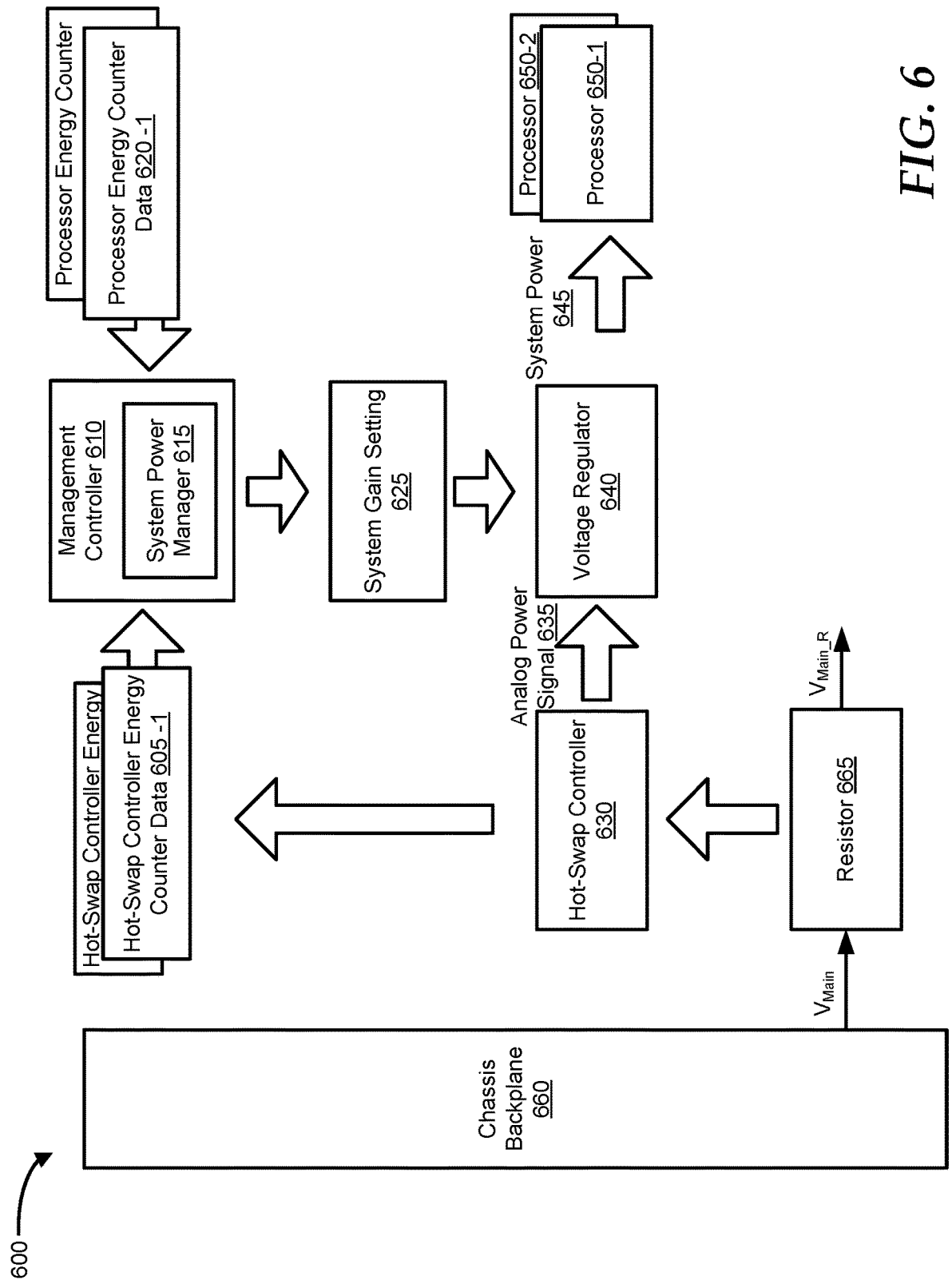
FIG. 6 is a block diagram illustrating a method for calibrating processor system power consumption, according to an embodiment of the present disclosure.

FIG. 6 shows a system 600 for calibrating processor system power consumption. In this example, system 600, which is similar to system 300, provides a closed loop calibration algorithm that may be used to dial out the error of the analog power signal to deliver more accurate results continually. System 600 includes a management controller 610, a hot-swap controller, a voltage regulator 640, processors 650-1 through 650-n (also referred to as "processors 650" or processor 650"), and a chassis backplane 660 which includes power supply units, wherein voltage regulator 640 is between the power supply units and processors 650. System 600 may be part of an information handling system, such as information handling system 100 of FIG. 1.

In this example, chassis backplane 660 may include various components or devices, such as one or more information handling systems, power supply units, I/O controllers, etc. In this example, the power supply units are modular power supply units that provide the components or devices of the chassis with power. In certain embodiments, the power supply units may be implemented with a sled that provides chassis backplane 660 with redundant and hot-swappable power supply units. The power supply units provide a main power source, such as $V_{Main}$, which may pass through a resistor 665 before reaching hot-swap controller 630.

Hot-swap controller 630 may be configured to provide I2C/control data and/or telemetry data such as current, voltage, power, and temperature readback to management controller 610. In particular, hot-swap controller 630 may be configured to may periodically read energy counters of the power supply units and provide hot-swap controller energy counter data 605-1 through 605-n (also referred to as "hot-swap controller energy counter data 605") to management controller 610 based on readings from one or more energy counters of the power supply units. Processor energy counter data 620-1 through 620-n (also referred to as "processor energy counter data 620") may include average power consumption reading from each of energy counters of processors 650.

Based on whether processor energy counter data 620 matches hot-swap controller energy counter data 605, system power manager 615 calculates the value of system gain setting 625 which may have watts/volts as its unit of measurement. System gain setting 625 may then be programmed into voltage regulator 640. Voltage regulator 640 may receive analog power signal 635 from hot-swap controller 630 as input and may output system power 645 based on analog power signal 635 and system gain setting 625. System power 645 may represent instantaneous power transmitted to processors 650 for consumption. In this example, analog power signal 635 is similar to analog power signal 212 of FIG. 2, while system gain setting 625 is similar to system gain setting 217 of FIG. 2, and system power 645 is similar to system power 222 of FIG. 2.

The system power manager 615 may be configured to calibrate system power 645 reported to the processors 650. The calibration may be performed based on hot-swap controller energy counter data 605 and processor energy counter data 520. Similar to system 300, the calibration may be used to address various issues, such as a mismatch between the power consumption of processors 650 and power provided by the power supply units.

Figure 7:
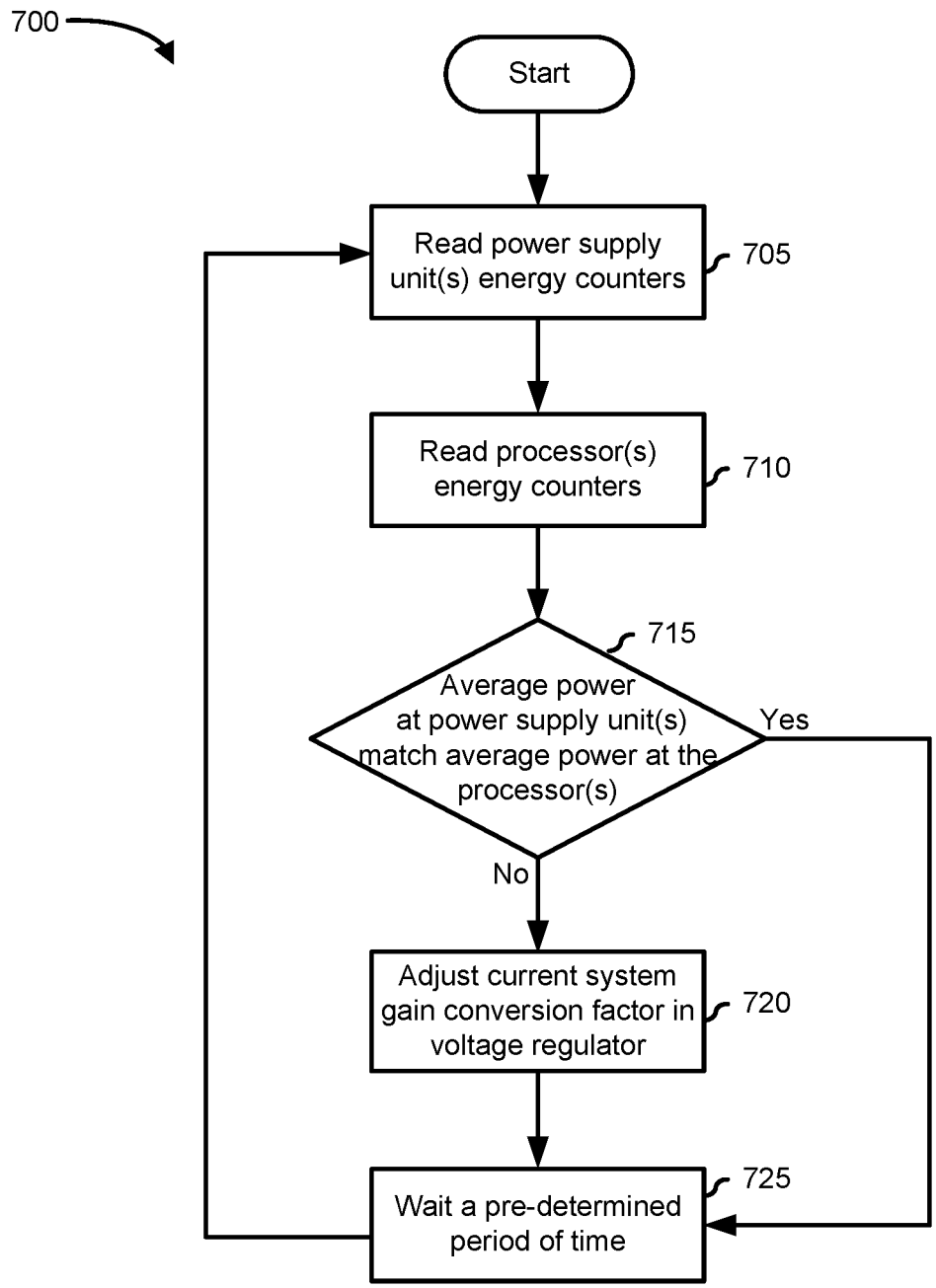
FIG. 7 is a flowchart illustrating a method for calibrating processor system power consumption, according to an embodiment of the present disclosure.

FIG. 7 shows a method 700 for calibrating processor system power consumption. The calibration may be performed by one or more components of FIG. 2, FIG. 3, FIG. 4, FIG. 5, and FIG. 6. However, while embodiments of the present disclosure are described in terms of system 200 of FIG. 2, system 300 of FIG. 3, system 400 of FIG. 4, system 500 of FIG. 5, and system 600 of FIG. 6, it should be recognized that other systems may be utilized to perform the described method. One of skill in the art will appreciate that this flowchart explains a typical example, which can be extended to advanced applications or services in practice.

Method 700 typically starts at block 705 where the method reads the energy counters of one or more power supply units. At block 710, the method reads the energy counters of one or more processors. At decision block 715, the method determines whether the average power at the processors is equal to the average power at the power supply units. If the average power at the processors is equal to the average power at the power supply units, then the "YES" branch is taken, and the method proceeds to block 725. If the average power at the processors is not equal to the average power provided by the power supply units, then the "NO" branch is taken, and the method proceeds to block 720. The average power consumption may be an average of the average power consumption of a plurality of processors. Similarly, the average power measured at the power supply may be an average of power measured at a plurality of power supplies.

At block 720, the method adjusts the value of the system gain setting and programs the adjusted value in the voltage regulator via a PMBus. For example, the method may update a register in the voltage regulator that is associated with the system gain setting. Calibrating the power consumption of the processor is performed such as the average power consumption of the processor matches the average power measurement at the power supply units. For example, if the average power consumed by the processor is ninety watts and the power measured at the power supply unit is one hundred watts, the system gain setting may be adjusted such that the average power consumed by the processor increases to one hundred watts.

This is performed to avoid over throttling or under throttling the processor among other issues when there is a mismatch between the power consumption of the processor and the power provided by the power supply unit. For example, the processor may be throttled if the system thinks that the processor is consuming more power than it actually does, which may affect the processor's performance. In another scenario, if the system thinks that the processor is consuming less power than it actually does, additional power may be provided to increase the processor's performance. This increase in power may exceed the power limit of a connector of the processor which may cause the connector to deteriorate.

Calibrating the system power includes calculating a value of the system gain setting based on the average power consumed by the processors versus the average power provided by the power supply units. The value of the system gain setting may vary in direct correlation with the average power consumption of the processor. For example, if the average power consumption of the processor is to be increased to match the average power provided by the power supply, then the system gain setting is increased. If the average power consumption of the processor is to be decreased to match the average power provided by the power supply, then the system gain setting is decreased. At block 725, the method may wait for a pre-determined period before proceeding to block 705. For example, the method may wait for one millisecond, five milliseconds, ten milliseconds, a hundred milliseconds, or the like.

Although FIG. 7 shows example blocks of method 700 in some implementations, method 700 may include additional blocks, fewer blocks, different blocks, or differently arranged blocks than those depicted in FIG. 7. Those skilled in the art will understand that the principles presented herein may be implemented in any suitably arranged processing system. Additionally, or alternatively, two or more of the blocks of method 700 may be performed in parallel. For example, block 705 and block 710 of method 700 may be performed in parallel.

As used herein, a hyphenated form of a reference numeral refers to a specific instance of an element and the un-hyphenated form of the reference numeral refers to the collective or generic element. Thus, for example, widget "72-1" refers to an instance of a widget class, which may be referred to collectively as widgets "72" and any one of which may be referred to generically as a widget "72."

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionalities as described herein.

When referred to as a "device," a "module," a "unit," a "controller," or the like, the embodiments described herein can be configured as hardware. For example, a portion of an information handling system device may be hardware such as, for example, an integrated circuit (such as an ASIC, a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The present disclosure contemplates a computer-readable medium that includes instructions or receives and executes instructions responsive to a propagated signal; so that a device connected to a network can communicate voice, video, or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that causes a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or another storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents but also equivalent structures.

What is claimed is:

1. A method comprising:
   determining, by a management controller, average power consumption of a processor;
   determining average power measurement at a power supply unit;
   determining whether the average power consumption of the processor matches the average power measurement at the power supply unit; and
   in response to determining that the average power consumption of the processor does not match the average power measurement at the power supply unit, calibrating the average power consumption of the processor to match the average power measurement at the power supply unit, wherein the calibrating of the average power consumption of the processor includes adjusting a value of a system gain setting in a voltage regulator.

2. The method of claim 1, wherein instantaneous power provided to the processor is updated based on the adjusted value of the system gain setting.

3. The method of claim 1, wherein the system gain setting is a register in the voltage regulator.

4. The method of claim 1, wherein the voltage regulator receives an analog power signal from the power supply unit.

5. The method of claim 1, further comprising reading a processor energy counter to determine the average power consumption of the processor.

6. The method of claim 1, further comprising reading a power supply energy counter to determine the average power measurement at the power supply unit.

7. The method of claim 1, wherein the average power consumption is based on an instantaneous power to the processor over a period of time.

8. An information handling system, comprising:
   a management controller; and
   a memory device storing instructions that when executed cause the management controller to perform operations, the operations including:
   determining average power consumption of a processor;
   determining average power measurement at a power supply unit;
   determining whether the average power consumption of the processor matches the average power measurement at the power supply unit; and
   in response to determining that the average power consumption of the processor does not match the average power measurement at the power supply unit, calibrating the average power consumption of the processor to match the average power measurement at the power supply unit, wherein the calibrating of the average power consumption of the processor includes adjusting a value of a system gain setting in a voltage regulator.

9. The information handling system of claim 8, wherein instantaneous power provided to the processor is updated based on the adjusted value of the system gain setting.

10. The information handling system of claim 8, wherein the voltage regulator receives an analog power signal from the power supply unit.

11. The information handling system of claim 8, further comprising reading a processor energy counter to determine the average power consumption of the processor.

12. The information handling system of claim 8, further comprising reading a power supply energy counter to determine the average power measurement at the power supply unit.

13. The information handling system of claim 8, wherein the average power consumption is based on an instantaneous power to the processor over a period of time.

14. A non-transitory computer-readable medium to store instructions that are executable to perform operations comprising:
    determining average power consumption of a processor;
    determining an average power measurement at a power supply unit; and
    if the average power consumption of the processor does not match the average power measurement at the power supply unit, then calibrating the average power consumption of the processor to match the average power measurement at the power supply unit, wherein the calibrating of the average power consumption of the processor includes adjusting a value of a system gain setting in a voltage regulator.

15. The non-transitory computer-readable medium of claim 14, wherein instantaneous power provided to the processor is updated based on the adjusted value of the system gain setting.

16. The non-transitory computer-readable medium of claim 14, wherein the voltage regulator receives an analog power signal from the power supply unit.

17. The non-transitory computer-readable medium of claim 14, wherein the instructions further comprise reading a processor energy counter to determine the average power consumption of the processor.

18. The non-transitory computer-readable medium of claim 14, wherein the instructions further comprise reading a power supply energy counter to determine the average power measurement at the power supply unit.

19. The non-transitory computer-readable medium of claim 14, wherein the average power consumption is based on an instantaneous power to the processor over a period of time.

20. The non-transitory computer-readable medium of claim 14, wherein the system gain setting is a register in the voltage regulator.

\* \* \* \* \*